United States Patent [19]
Soda

[11] Patent Number: 6,104,771
[45] Date of Patent: Aug. 15, 2000

[54] PHASE LOCKED LOOP CAPABLE OF SYNCHRONIZING OUTPUT CLOCK SIGNAL WITH INPUT SIGNAL WHEN VCO CONTROLLER HAS INSENSITIVE INPUT VOLTAGE RANGE

[75] Inventor: Masaaki Soda, Tokyo, Japan

[73] Assignee: NEC Corporation, Tokyo, Japan

[21] Appl. No.: 08/953,574

[22] Filed: Oct. 17, 1997

[30] Foreign Application Priority Data

Oct. 18, 1996 [JP] Japan .................................. 8-276313

[51] Int. Cl.[7] ........................................ H03D 3/24
[52] U.S. Cl. .......................................... 375/376; 327/157
[58] Field of Search ................................ 375/376, 373, 375/374; 327/141, 148, 156, 157, 536

[56] References Cited

U.S. PATENT DOCUMENTS 5,475,326  12/1995  Masuda ................................. 327/157

OTHER PUBLICATIONS

I.A. Young, et al., "A PLL Clock Generator With 5 to 110MHz Lock Range for Microprocessors", 1992 IEEE International Solid–State Circuits Conference, Digest of Technical Papers, pp. 50–51.

*Primary Examiner*—Don N. Vo
*Assistant Examiner*—Phuong Phu
*Attorney, Agent, or Firm*—Ostrolenk, Faber, Gerb & Soffen, LLP

[57] ABSTRACT

A phase locked loop has a voltage comparator (41) which compares a control voltage Vf supplied from a filter (15) to a voltage controlled oscillator (16) with a reference voltage VR1 supplied with a reference voltage supplying terminal (42). The reference voltage VR1 is not lower than a maximum voltage of an insensitive range of a VCO controller (17). When the control voltage Vf is lower than the reference voltage VR1, the voltage comparator 41 produces a logic high level signal. A charge pump (43) annuls a discharge signal supplied from a phase comparator (13) in response to the logic high level signal sent from the voltage comparator (41). The phase comparator (13) compares an input signal with an output clock signal supplied from the voltage controlled oscillator (16) to produce the discharge signal.

5 Claims, 6 Drawing Sheets

PHASE LOCKED LOOP CAPABLE OF SYNCHRONIZING OUTPUT CLOCK SIGNAL WITH INPUT SIGNAL WHEN VCO CONTROLLER HAS INSENSITIVE INPUT VOLTAGE RANGE

BACKGROUND OF THE INVENTION

This invention relates to a phase locked loop, in particular, to a phase locked loop having a VCO controller with an insensitive input voltage range.

Generally, a phase locked loop is used for reproduction of a clock signal which is synchronized with an input or received signal in a field of communication devices.

A conventional phase locked loop includes a voltage controlled oscillator which has a VCO controller and an oscillator and which produces a clock signal in response to a control voltage. A phase comparator is connected to both the voltage controlled oscillator and an input terminal which is supplied with an input signal. The phase comparator compares a phase of the clock signal with a phase of the input signal to produce charge and discharge signals in response to a phase difference between the clock signal and the input signal. A charge pump is connected to the phase comparator and produces charge/discharge current in response to the charge and the discharge signals. A filter is connected to the charge pump and filters the charge/discharge current to produce the control voltage supplied to the VCO controller.

In this structure, the phase locked loop can synchronize the clock signal with the input signal.

However, the VCO controller has an insensitive range in which it is insensitive to the control voltage. Namely, when the control voltage is within the insensitive range, the phase locked loop can not synchronize the clock signal with the input signal. Therefore, it is required to adjust the control voltage to be within a sensitive range of the VCO controller at when the operation of the conventional phase locked loop starts.

SUMMARY OF THE INVENTION

It is therefore an object of this invention to provide a phase locked loop which can synchronize an output clock signal with an input signal regardless of an insensitive range of a VCO controller.

It is another object of this invention to provide a phase locked loop which can synchronize an output clock signal with an input signal without adjustment at a start of operation.

Other objects of this invention will become clear as the description proceeds.

In order to understand the gist of this invention, it should be noted that a phase locked loop produces an output clock signal which is provided to an output terminal and which is synchronized with an input signal supplied to an input terminal. The phase locked loop includes a phase comparator which is connected to the input terminal and the output terminal and compares a phase of the input signal with a phase of the output clock signal to produce charge and discharge signals in response to a phase difference between the input signal and the output clock signal. A charge pump is connected to the phase comparator to produce charge/discharge current in response to the charge and the discharge signals. A filter is connected to the charge pump and filters the charge/discharge current to produce a control voltage. A voltage controlled oscillator is connected to the filter to produce the output clock signal in response to the control voltage.

According to an aspect of this invention, the if phase locked loop comprises a first reference voltage supplying terminal which is supplied with a first reference voltage. A first voltage comparator is connected to the filter and the first reference voltage supplying terminal and compares the control voltage with the first reference voltage to produce a first comparison signal in response to a difference between the control voltage and the first reference voltage. A first annulling section is connected to the first voltage comparator and the charge pump to annul one of the charge and the discharge signals in response to the first comparison signal.

DESCRIPTION OF THE PREFERRED EMBODIMENTS

Figure 1:
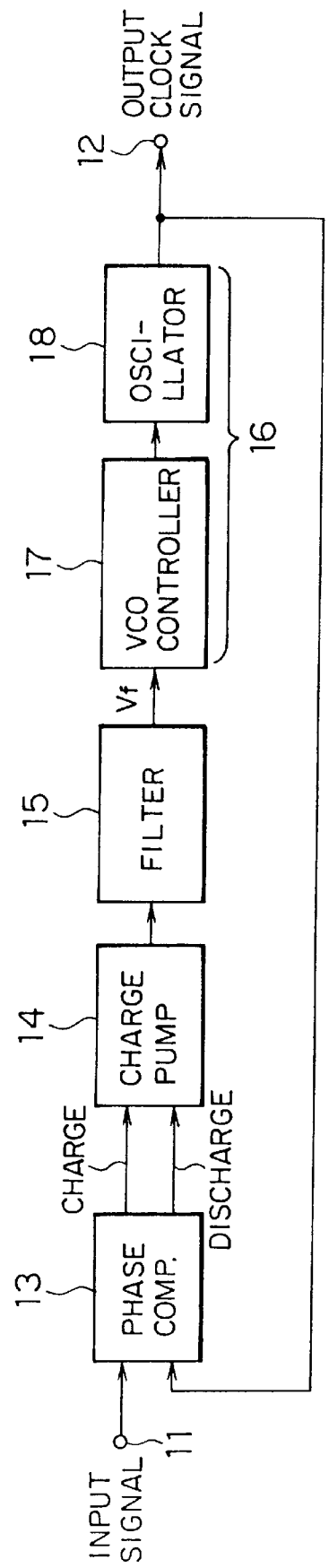
FIG. 1 is a block diagram of a conventional phase locked loop.
Figure 2:
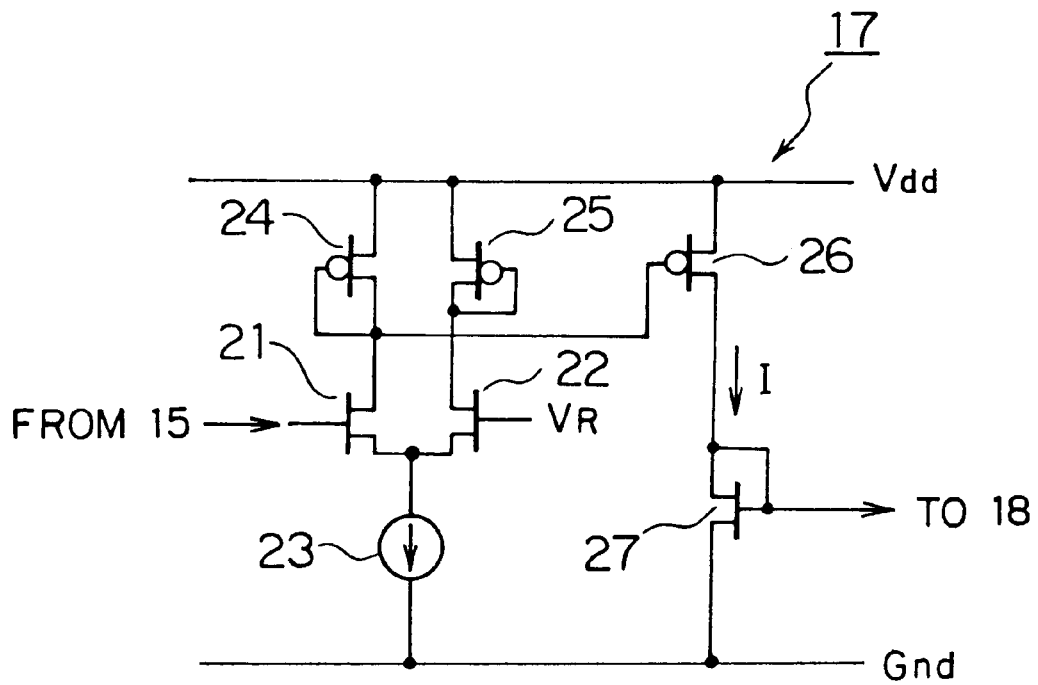
FIG. 2 is a circuit diagram of a VCO controller included in the conventional phase locked loop of FIG. 1.
Figure 3:
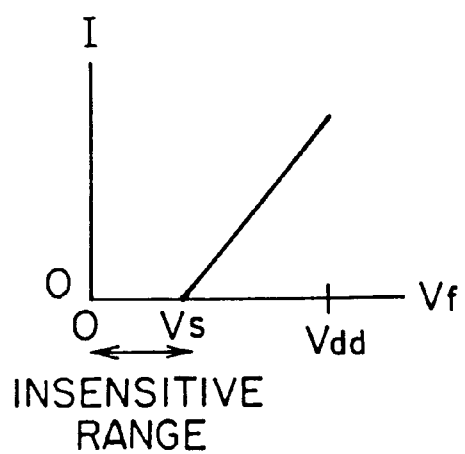
FIG. 3 is a graph representative of an input-output characteristic of the VCO controller of FIG. 2.

Referring to FIGS. 1 through 3, description will be at first directed to a conventional phase locked loop for a better understanding of this invention.

In FIG. 1, a conventional phase locked loop has an input terminal 11 for a reception of an input signal and an output terminal 12 for a provision of an output clock signal. A phase comparator 13 is connected to both the input terminal 11 and the output terminal 12 and compares a phase of the input signal with a phase of the output clock signal to produce charge and discharge signals in response to a phase difference between the input signal and the output clock signal. A charge pump 14 is connected to the phase comparator 13 and produces a charge/discharge current in response to the charge and the discharge signals. A filter 15 is connected to the charge pump 14 and filters the charge/discharge current to produce a frequency control voltage Vf. A voltage controlled oscillator (VCO) 16 has a VCO controller 17 which is connected to the filter 15 and has an oscillator 18 which is connected between the VCO controller 17 and the output terminal 12. The VCO controller 17 controls an oscillating frequency of the oscillator 18 to produce the output clock signal which is synchronized with the input signal. The oscillator 18 is controlled by the VCO controller 17 and produces the output clock signal having the oscillating frequency decided by the frequency control voltage Vf to provide the output clock signal to the output terminal 12.

The phase comparator 13 compares a phase of the input signal with a phase of the output clock signal. If the phase of the output clock signal is behind the phase of the input signal, the phase comparator 13 produces the charge signal. When the phase of the output clock signal is ahead of the phase of the input signal, the phase comparator 13 produces the discharge signal. For example, the charge signal has a logic "0" level while the discharge signal has a logic "1" level.

Figure 5:
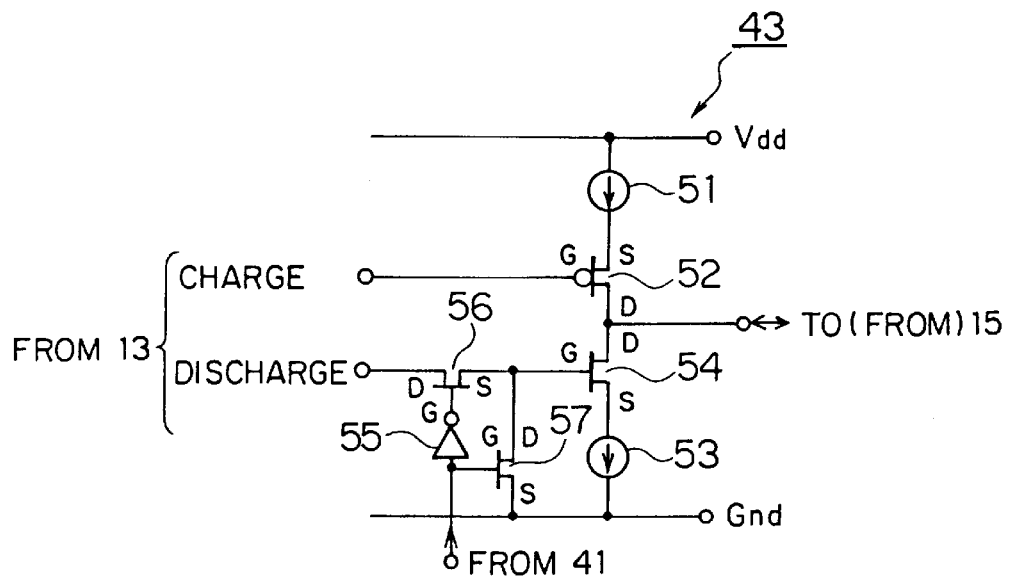
FIG. 5 is a circuit diagram of a charge pump included in the phase locked loop of FIG. 4.

The charge pump 14 has a charge current source and a discharge current source (ref. FIG. 5). When the charge pump 14 receives the charge signal, it charges a capacitor (not shown) of the filter 15 by use of the charge current source. When the charge pump 14 receives the discharge signal, it discharges the capacitor of the filter 15 by use of the discharge current source.

The filter 15 is, for example, a loop filter which has the capacitor and a resistor (not shown). The filter 15 provides the frequency control voltage Vf in response to charging and discharging carried out by the charge pump 14. Moreover, the filter 15 decides a time constant of the phase locked loop.

The VCO controller 17 changes the control voltage Vf into control current to control the oscillating frequency of the oscillator 18. For example, the VCO controller 17, is formed as shown in FIG. 2.

In FIG. 2, the VCO controller 17 has a differential circuit which consists of a pair of NMOS transistors 21 and 22 and a current source 23. PMOS transistors 24 and 25 are connected to the NMOS transistors 21 and 22, respectively, for loads. A current mirror circuit consists of the PMOS transistor 24 and another PMOS transistor 26. Another NMOS transistor 27 forms another current mirror circuit together with a current source of the oscillator 18.

In this structure, a gate of the NMOS transistor 21 is supplied with the frequency control voltage Vf from the filter 15 and a gate of the NMOS transistor 22 is supplied with a reference voltage VR from a reference voltage source (not shown) for the VCO controller 17. If the frequency control voltage Vf changes, current flowing through the PMOS transistor 24 changes together with change of the frequency control voltage Vf. Then, current flowing through the PMOS transistor 26 (i.e. through the NMOS transistor 27) changes together with change of the current flowing through the PMOS transistor 24. The current flowing through the NMOS transistor 27 changes current flowing through the current source of the oscillator 18. As a result, the oscillating frequency of the oscillator 18 is changed by the frequency control voltage Vf.

Because the phase locked loop uses the charge pump 14 as mentioned above, the frequency control voltage Vf changes from 0 [V] to a power source voltage Vdd. However, the VCO controller 17 has input-output characteristics as shown in FIG. 3. Namely, the VCO controller 17 has an insensitive input voltage range which has a maximum voltage Vs. If the frequency control voltage Vf is within the insensitive input voltage range, the VCO controller 17 produces a constant current (i.e. 0 [A]) regardless of its value of the frequency control voltage Vf. This means that feedback of the phase locked loop is not realized when the frequency control voltage Vf is within the insensitive input voltage range. Therefore, unless the frequency control voltage Vf is higher than the maximum voltage Vs, the output clock signal does not synchronize with the input signal. As a result, it needs to adjust the frequency control voltage Vf over the maximum voltage Vs, when operation begins.

Such a conventional phase locked loop is disclosed in a paper which was contributed by Ian A. Young, Jeff K. Greason, Jeff E. Smith, and Keng L. Wong in "1992 IEEE International Solid-State Circuits Conference" and which is entitled "A PLL Clock Generator with 5 to 110 MHz Lock Range for Microprocessors" in "DIGEST OF TECHNICAL PAPERS".

Figure 4:
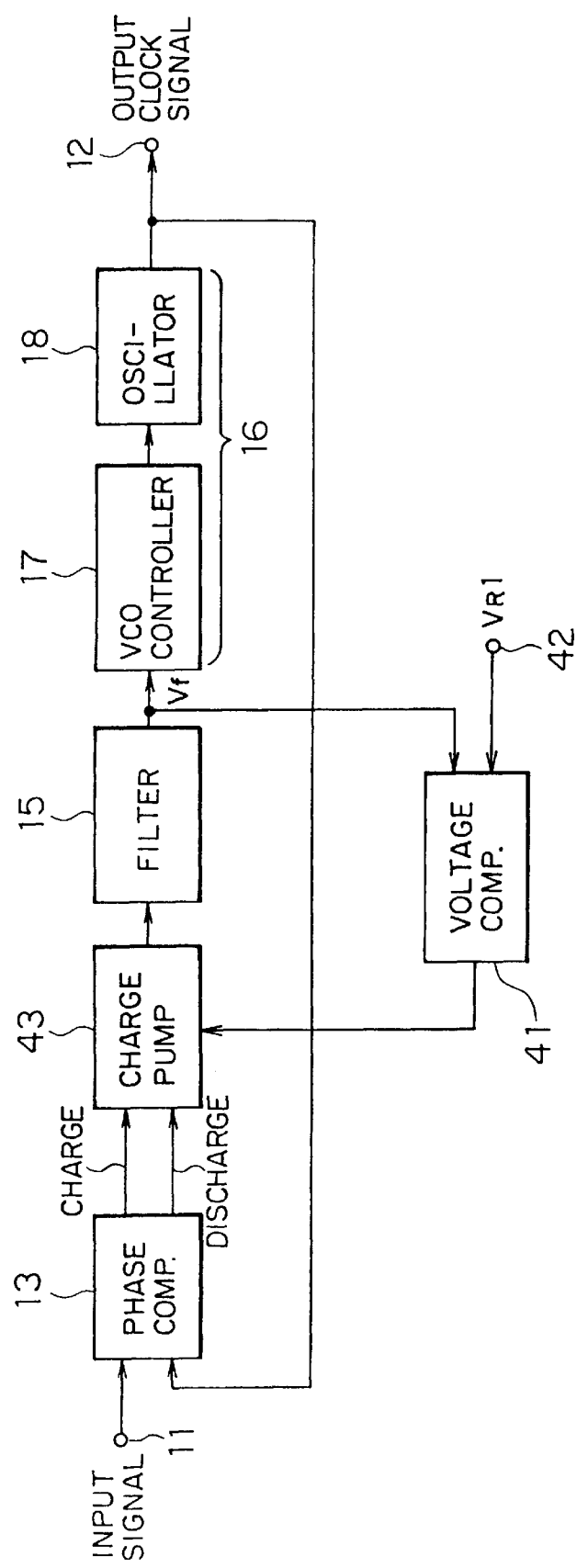
FIG. 4 is a block diagram of a phase locked loop according to a first embodiment of this invention.
Figure 6:
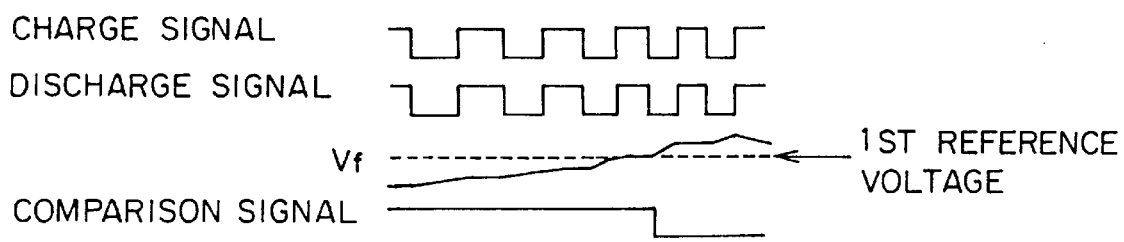
FIG. 6 shows waveforms at principal points of the phase locked loop of FIG. 4.

Referring to FIGS. 4 through 6, description will be made about a phase locked loop according to a first embodiment of this invention. Similar parts are designated by like reference numerals and symbols.

In FIG. 4, the phase locked loop comprises a first voltage comparator 41 which is connected to the filter 15 and a first reference voltage input terminal 42. The voltage comparator 41 compares the frequency control voltage Vf with a first reference voltage VR1 supplied to the first reference voltage input terminal 42 and produces a first comparison signal. A charge pump 43 is connected to the phase comparator 13 and the filter 15 in place of the charge pump 14 shown in FIG. 1. The charge pump 43 is further connected to the first voltage comparator 41 to annul the discharge signal in response to the first comparison signal.

The first reference voltage VR1 is set over the maximum voltage Vs of FIG. 3. The first voltage comparator 41 supplies the first comparison signal having a logic "1" (i.e. high) level to the charge pump 43 when the frequency control voltage Vf is not higher than the first reference voltage VR1, while the first voltage comparator 41 supplies the first comparison signal having a logic "0" (i.e. low) level to the charge pump 43 when the frequency control voltage Vf is higher than the first reference voltage VR1.

The charge pump 43 is, for example, formed as shown in FIG. 5. In FIG. 5, the charge pump 43 comprises a charge current source 51 which is supplied with a power source voltage Vdd from a power supply (not shown) to produce a charge current supplied to the filter 15. A first PMOS transistor 52 has a source connected to the first current source 51, a gate connected to the phase comparator 13, and a drain connected to the filter 15 to supply the charge current to the filter 15 in response to the charge signal sent from the phase comparator 13. A discharge current source 53 is grounded to draw a discharge current from the filter 15. A first NMOS transistor 54 has a source connected to the discharge current source 54, a gate supplied with the discharge signal sent from the phase comparator 13, and a drain connected to the filter 15 to draw the discharge current from the filter 15 in response to the discharge signal. A first inverter 55 is connected to the first voltage comparator 41 and inverts the first comparison signal to produce a first inverted signal. A second NMOS transistor 56 has a drain connected to the phase comparator 13, a gate connected to the first inverter 55, and a source connected to the gate of the first NMOS transistor 54 to prevent the discharge signal from passing through in response to the first inverted signal. A third NMOS transistor 57 has a gate connected to the first voltage comparator 41, a drain connected to the gate of the first NMOS transistor 54, and a source connected to the ground to ground the gate of the first NMOS transistor 54 in response to the first comparison signal.

The charge current source 51 and the first PMOS transistor 52 form a charging section which charges the capacitor of the filter 15 while the discharge current source 53 and the first NMOS transistor 54 form a discharging section which discharges the capacitor. The first inverter 55, the second NMOS transistor 56, and the third NMOS transistor 57 form a annulling section that annuls the discharge signal. The charge current and the discharge current form the charge/discharge current sent from the charge pump 43 to the filter 15.

Operation of the charge pump 43 will now be illustrated.

The phase comparator 13 produces either the charge signal or the discharge signal in response to the phase difference between the output clock signal and the input signal. When the gate of the first PMOS transistor 52 is supplied with the charge signal from the phase comparator 13, the first PMOS transistor 52 turns into an ON state. Then, the charge current flows from the charge current source 51 to the filter 15 through the first PMOS transistor 52.

If the first comparison signal has the logic "0" level, the second NMOS transistor 56 is in an ON state and the third NMOS transistor 57 is in an OFF state. Accordingly, the discharge signal sent from the phase comparator 13 is supplied to the gate of the first NMOS transistor 54 in this situation. The first NMOS transistor 54 turns into an ON state in response to the discharge signal and the discharge current is drawn from the filter 15 by the second current source 53.

If the first comparison signal has the logic "1" level, the second NMOS transistor 56 is in an OFF state and the third NMOS transistor 57 is in an ON state. Accordingly, the gate of the first NMOS transistor 54 is grounded through the third NMOS transistor and the first NMOS transistor 54 is in an OFF state. In this case, the discharge signal does not bring the discharge current.

Namely, the discharge signal is annulled by the first comparison signal having the logic "1" level.

In FIG. 6, the frequency control voltage Vf is not higher than the first reference voltage at the left side of the diagram. In this situation, the frequency control voltage Vf is gradually raised by the charge current, because the discharge signal is annulled by the first comparison signal as mentioned above and only the charge signal is used for production of the charge/discharge signal at the charge pump 43.

When the frequency control voltage Vf is higher than the first reference voltage as is shown at the right side of FIG. 6, the frequency control voltage Vf nears a pertinent value while it repeats small rises and falls. In other words, the phase locked loop operates like the conventional phase locked loop of FIG. 1.

In practice, a trial phase locked loop for an optical communication of 2.4 Gb/s was produced. Because the phase locked loop had a VCO controller with an insensitive input voltage range which had a maximum voltage of 0.6 volts, a first reference voltage supplied to a first voltage comparator of the phase locked loop was set at 0.7 volts. The phase locked loop could synchronize an output clock signal with an input signal without any adjustment when operation was started.

Figure 7:
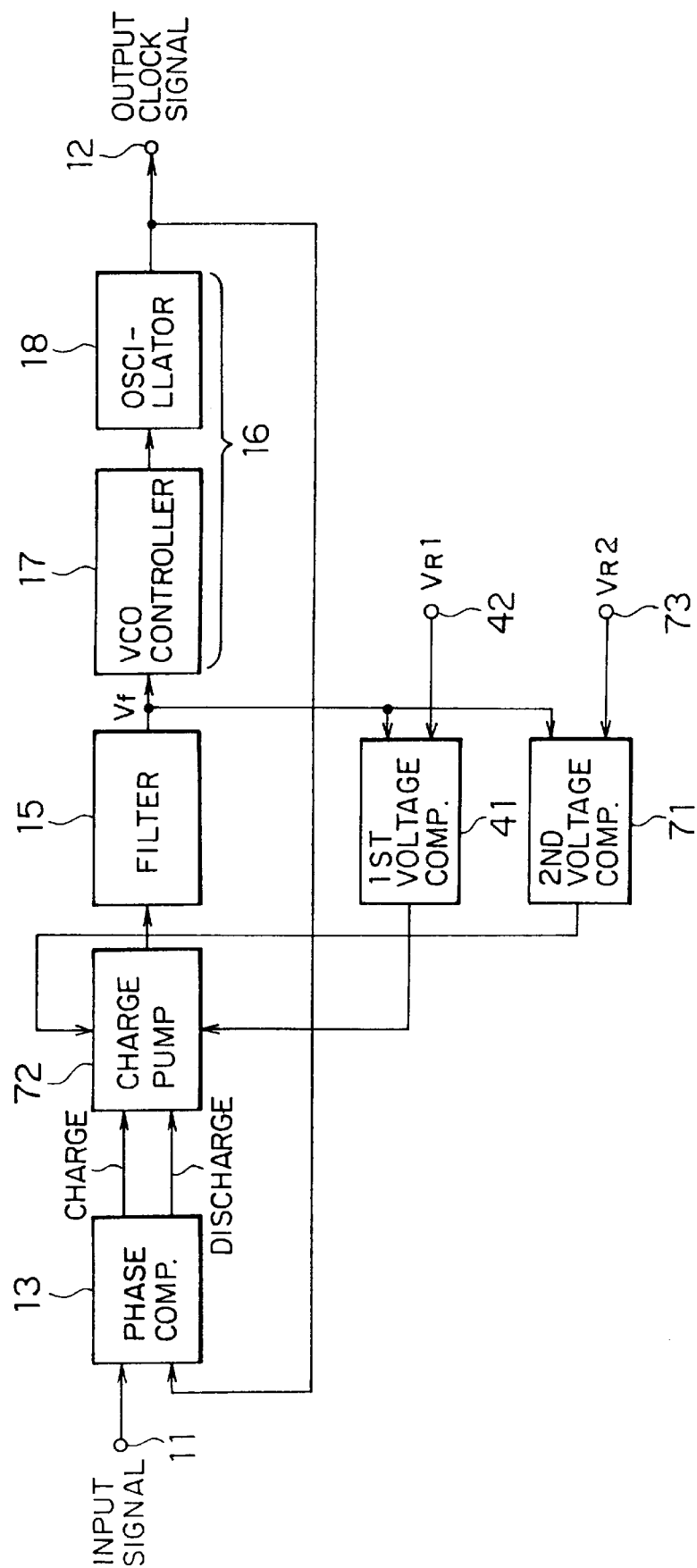
FIG. 7 is a block diagram of a phase locked loop according to a second embodiment of this invention.
Figure 8:
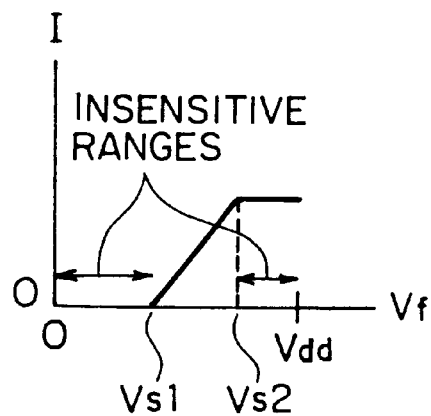
FIG. 8 is a graph representative of an input-output characteristic of a VCO controller included in the phase locked loop of FIG. 7.
Figure 9:
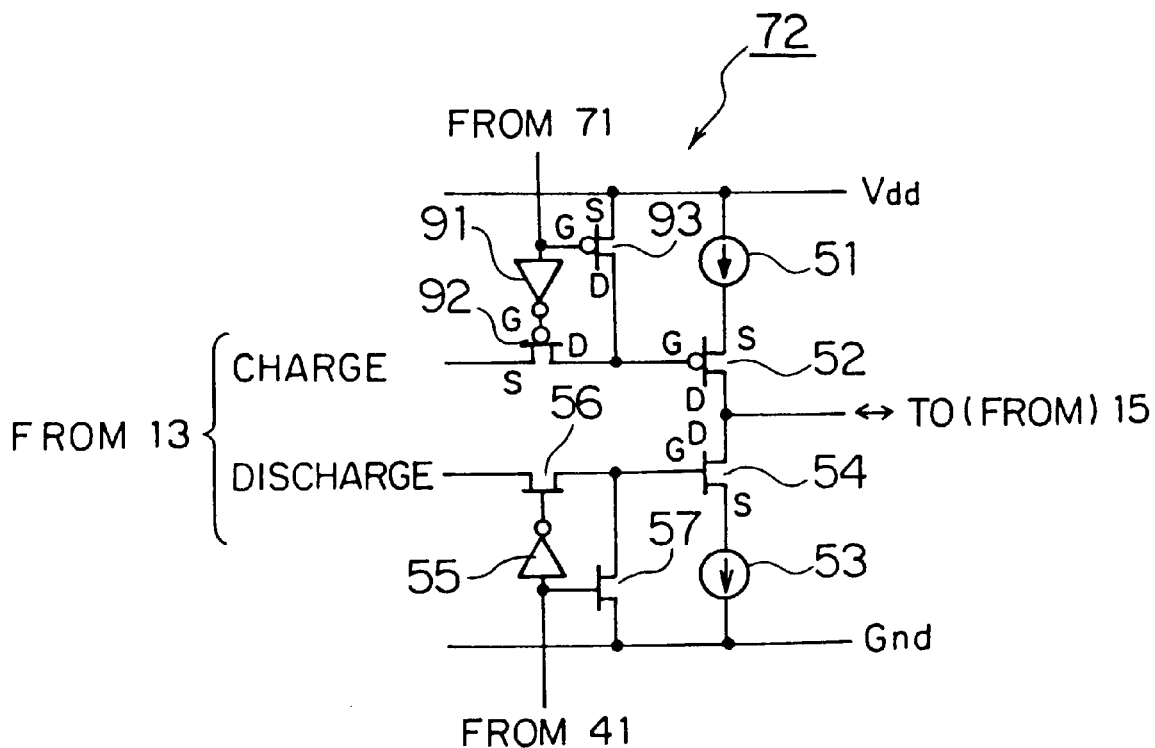
FIG. 9 is a circuit diagram of a charge pump included in the phase locked loop of FIG. 7.

Referring to FIGS. 7 through 9, description will be made about a phase locked loop according to a second embodiment of this invention.

In FIG. 7, the phase locked loop has the same structure as the phase locked loop illustrated in FIG. 4 with the addition of a second voltage comparator 71 and a charge pump 72.

The second voltage comparator 71 is similar to the first comparator 41 but it is supplied with a second reference voltage VR2 from a second reference voltage input terminal 73. The second reference voltage VR2 is different from the first reference voltage VR1 is described below.

In this embodiment, it is assumed that the VCO controller 17 has two insensitive input voltage ranges as illustrated in FIG. 8. The lower insensitive input voltage range has a maximum voltage Vs1 and the higher insensitive input voltage range has a minimum voltage Vs2.

The first reference voltage VR1 is set at a first value which is not lower than the maximum voltage Vs1 and the second reference voltage VR2 is set at a second value which is not higher than the minimum voltage Vs2. The first value is smaller than the second value.

The first voltage comparator 41 produces the first comparison signal. The first comparison signal has the logic "1" level when the frequency control voltage Vf is not higher than the first reference voltage and has the logic "0" level when the frequency control voltage Vf is higher than the first reference voltage. The second voltage comparator 71 produces a second comparison signal. The second comparison signal has a logic "0" level when the frequency control voltage Vf is higher than the second reference voltage and has a logic "1" level when the frequency control voltage Vf is not higher than the second reference voltage.

The charge pump 72 annuls the discharge signal and the charge signal sent from the phase comparator 13 in response to the first comparison signal having the logic "1" level and the second comparison signal having the logic "0" level, respectively. The charge pump 72 is, for example, structured as shown in FIG. 9.

In FIG. 9, the charge pump 72 comprises the same structure as the charge pump 43 of FIG. 5 with the addition of the following elements. A second inverter 91 is connected to the second voltage comparator 71 to invert the second comparison signal. A second PMOS transistor 92 has a gate connected to the second inverter 91, a source connected to the phase comparator 13 to receive the charge signal, and a drain connected to the gate of the first PMOS transistor 52. A third PMOS transistor 93 has a gate connected to the second voltage comparator 71, a source supplied with the power source voltage Vdd, and a drain connected to the gate of the first PMOS transistor 52.

When the frequency control voltage Vf is not higher than the second reference voltage VR2, the second voltage comparator 71 supplies the second comparison signal having the logic "1" level to both the second inverter 91 and the gate of the third PMOS transistor 93. The second inverter 91 inverts the second comparison signal VR2 to supply a second inverted signal having the logic "0" level to the gate of the second PMOS transistor 92. The second PMOS transistor 92 is an ON state when its gate is supplied with the second inverted signal having the logic "0" level from the second inverter 91. The third PMOS transistor 93 turns into an OFF state in response to the second comparison signal having the logic "1" level supplied from the second voltage comparator 71. In this situation, the charge pump 72 operates like the charge pump 43 of FIG. 4.

On the other hand, the second voltage comparator 71 supplies the second comparison signal having the logic "0" level to both the second inverter 91 and the base of the third PMOS transistor 93 when the frequency control voltage Vf is higher than the second reference voltage VR2. The second inverter 91 inverts the second comparison signal into the second inverted signal having the logic "1" level and makes the second PMOS transistor 92 be an OFF state by use of the second inverted signal. The third PMOS transistor 93 turns into an ON state in response to the second comparison signal having the logic "0" level supplied from the second voltage comparator 71. Then, the second PMOS transistor 92 annuls the charge signal sent from the phase comparator 13 and the third PMOS transistor 93 supplies the power source voltage Vdd to the gate of the first PMOS transistor 52. Therefore, the first PMOS transistor 52 becomes the OFF state regardless of the charge signal. As a result, the charge pump 72 only produces the discharge current in response to the discharge signal send from the phase comparator 13 and the frequency control voltage Vf gradually decreases to the second reference voltage.

Therefore, though the phase locked loop includes the VCO controller having two of the insensitive input voltage ranges, it can synchronize the output clock signal with the input signal without any adjustment in a start of an operation.

While this invention has thus far been described in conjunction with embodiments thereof, it will be readily possible for those skilled in the art to put this invention into practice in various other manners.

For example, the first voltage comparator may be removed when the VCO controller does not have the lower insensitive range. In this case, the first inverter, the second NMOS transistor, and the third NMOS transistor may be removed from the charge pump.

What is claimed is:

1. A phase locked loop for producing an output clock signal which is provided to an output terminal and which is synchronized with an input signal supplied to an input terminal, said phase locked loop comprising:
    a phase comparator connected to said input terminal and said output terminal, said phase comparator comparing a phase of said input signal with a phase of said output clock signal and producing charge and discharge signals in response to a phase difference between said input signal and said output clock signal;
    a charge pump, connected to said phase comparator, said charge pump producing one of a charge and a discharge current in response to said charge and said discharge signals;
    a filter, connected to said charge pump, said filter filtering said charge and discharge currents and producing a control voltage in response thereto;
    a voltage controlled oscillator circuit, connected to said filter, said voltage controlled oscillator circuit producing said output clock signal in response to said control voltage;
    a first voltage comparator, connected to said filter, said first voltage comparator comparing said control voltage with a first reference voltage and producing a first comparison signal in response to a difference between said control voltage and said first reference voltage; and
    a first enabling circuit connected to said first voltage comparator and said charge pump, said first enabling circuit disabling only one of said charge and said discharge signals in response to said first comparison signal;
    said voltage controlled oscillator circuit comprising:
        an oscillator controller which is connected to said filter and producing a control signal in response to said control voltage; and
        an oscillator which is connected to oscillator controller and said output terminal, said oscillator producing said output clock signal in response to said control signal and supplying said output clock signal to said output terminal;
    said first enabling circuit disabling said discharge signal when said control voltage is not higher than said first reference voltage;
    said charge pump further comprises:
        a charge current source supplied with a power source voltage;
        a first PMOS transistor which has a gate supplied with said charge signal, a source connected to said charge current source, and a drain connected to said filter;
        a discharge current source connected to ground; and
        a first NMOS transistor which has a gate supplied with said discharge signal, a source connected to said second current source, and a drain connected to said filter;
    said first voltage comparator producing said first comparison signal having a logic high level when said control voltage is not higher than said first reference voltage, and wherein said first enabling circuit comprises:
        a first inverter connected to said first voltage comparator which inverts said first comparison signal to produce a first inverted signal having a logic low level;
        a second NMOS transistor having a gate connected to said first inverter, a drain supplied with said discharge signal, and a source connected to said gate of said first NMOS transistor, said second NMOS transistor disabling said discharge signal when said first inverted signal has said logic low level; and
        a third NMOS transistor having a gate connected to said first voltage comparator, a drain connected to said gate of said first NMOS transistor, and a source connected to ground, said third MOS transistor grounds said gate of said first NMOS transistor when said first comparison signal is said logic high level.

2. A phase locked loop for producing an output clock signal which is provided to an output terminal and which is synchronized with an input signal supplied to an input terminal, said phase locked loop comprising:
    a phase comparator connected to said input terminal and said output terminal, said phase comparator comparing a phase of said input signal with a phase of said output clock signal and producing charge and discharge signals in response to a phase difference between said input signal and said output clock signal;
    a charge pump, connected to said phase comparator, said charge pump producing one of a charge and a discharge current in response to said charge and said discharge signals;
    a filter, connected to said charge pump, said filter filtering said charge and discharge currents and producing a control voltage in response thereto;
    a voltage controlled oscillator circuit, connected to said filter, said voltage controlled oscillator circuit producing said output clock signal in response to said control voltage;
    a first voltage comparator, connected to said filter, said first voltage comparator comparing said control voltage with a first reference voltage and producing a first comparison signal in response to a difference between said control voltage and said first reference voltage; and
    a first enabling circuit connected to said first voltage comparator and said charge pump, said first enabling circuit disabling only one of said charge and said discharge signals in response to said first comparison signal;
    said voltage controlled oscillator circuit comprising:
        an oscillator controller which is connected to said filter and producing a control signal in response to said control voltage; and
        an oscillator which is connected to oscillator controller and said output terminal, said oscillator producing said output clock signal in response to said control signal and supplying said output clock signal to said output terminal;
said first enabling circuit disabling said charge signal when said control voltage is higher than said first reference voltage;
said charge pump comprises:
  a charge current source supplied with a power source voltage;
  a first PMOS transistor which has a gate supplied with said charge signal, a source connected to said charge current source, and a drain connected to said filter;
  a discharge current source connected to ground; and
  a first NMOS transistor which has a gate supplied with said discharge signal, a source connected to said second current source, and a drain connected to said filter;
said first voltage comparator producing a logic low level as said first comparison signal when said control voltage is higher than said first reference voltage; and
wherein said first enabling circuit comprises:
  a first inverter connected to said first voltage comparator, said first inverter inverts said first comparison signal to produce a first inverted signal having a logic high level;
  a second PMOS transistor having a gate connected to said first inverter, a source supplied with said charge signal, and a drain connected to said gate of said first PMOS transistor, said second PMOS transistor disabling said charge signal when said first inverted signal has said logic high level; and
  a third PMOS transistor having a gate connected to said first voltage comparator, a drain connected to said gate of said first PMOS transistor, and a source supplied with said power source voltage, said third PMOS transistor providing said power source voltage to said gate of said first PMOS transistor when said first comparison signal is said logic low level.

3. A phase locked loop for producing an output clock signal which is provided to an output terminal and which is synchronized with an input signal supplied to an input terminal, said phase locked loop comprising:
  a phase comparator connected to said input terminal and said output terminal, said phase comparator comparing a phase of said input signal with a phase of said output clock signal and producing charge and discharge signals in response to a phase difference between said input signal and said output clock signal;
  a charge pump, connected to said phase comparator, said charge pump producing one of a charge and a discharge current in response to said charge and said discharge signals;
  a filter, connected to said charge pump, said filter filtering said charge and discharge currents and producing a control voltage in response thereto;
  a voltage controlled oscillator circuit, connected to said filter, said voltage controlled oscillator circuit producing said output clock signal in response to said control voltage;
  a first voltage comparator, connected to said filter, said first voltage comparator comparing said control voltage with a first reference voltage and producing a first comparison signal in response to a difference between said control voltage and said first reference voltage; and
  a first enabling circuit connected to said first voltage comparator and said charge pump, said first enabling circuit disabling discharge signal in response to said first comparison signal, and wherein said phase locked loop further comprises:
  a second voltage comparator connected to said filter, said second voltage comparator comparing said control voltage with a second reference voltage having a voltage higher than said first reference voltage, to produce a second comparison signal; and
  a second enabling circuit connected to said second voltage comparator and said charge pump, said second enabling circuit disabling only said charge signal in response to said second comparison signal;
said first enabling circuit disabling said discharge signal when said control voltage is not higher than said first reference voltage and said second enabling circuit disabling said charge signal when said control voltage is higher than said second reference voltage;
said charge pump comprises:
  a charge current source supplied with a power source voltage;
  a first PMOS transistor which has a gate supplied with said charge signal, a source connected to said first current source, and a drain connected to said filter;
  a discharge current source connected to ground; and
  a first NMOS transistor which has a gate supplied with said discharge signal, a source connected to said discharge current source, and a drain connected to said filter;
wherein said first voltage comparator produces said first comparison signal having a logic high level when said control voltage is not higher than said first reference voltage;
and wherein said second voltage comparator produces said second comparison signal having a logic low level when said control voltage is higher than said second reference voltage;
said first enabling circuit further comprises:
  a first inverter connected to said first voltage comparator, said first inverter inverts said first comparison signal to produce a first inverted signal having a logic low level;
  a second NMOS transistor having a gate connected to said first inverter, a drain supplied with said discharge signal, and a source connected to said gate of said first NMOS transistor, said second MOS transistor disabling said discharge signal when said first inverted signal has said logic low level; and
  a third NMOS transistor having a gate connected to said first voltage comparator, a drain connected to said gate of said first NMOS transistor, and a source connected to ground, said third MOS transistor grounds said gate of said first NMOS transistor when said first comparison signal has said logic high level;
and wherein said second enabling circuit further comprises:
  a second inverter connected to said second voltage comparator, said second inverter inverts said second comparison signal to produce a second inverted signal having a logic high level;
  a second PMOS transistor having a gate connected to said second inverter, a source supplied with said charge signal, and a drain connected to said gate of said first PMOS transistor, said second PMOS transistor disabling said charge signal when said second inverted signal is at said logic high level; and a third PMOS transistor having a gate connected to said second voltage comparator, a drain connected to said gate of said first PMOS transistor, and a source supplied with said power source voltage, said third PMOS transistor providing said power source voltage to said gate of said first PMOS transistor when said second comparison signal is said logic low level.

4. A phase locked loop for producing an output clock signal which is provided to an output terminal and which is synchronized with an input signal supplied to an input terminal, said phase locked loop comprising:

a phase comparator connected to said input terminal and said output terminal, said phase comparator comparing a phase of said input signal with a phase of said output clock signal and producing charge and discharge signals in response to a phase difference between said input signal and said output clock signal;

a charge pump, connected to said phase comparator, said charge pump producing one of a charge and a discharge current in response to said charge and said discharge signals;

a filter, connected to said charge pump, said filter filtering said charge and discharge currents and producing a control voltage in response thereto;

a voltage controlled oscillator circuit, connected to said filter, said voltage controlled oscillator circuit producing said output clock signal in response to said control voltage;

a first voltage comparator, connected to said filter, said first voltage comparator comparing said control voltage with a first reference voltage and producing a first comparison signal in response to a difference between said control voltage and said first reference voltage; and a first enabling circuit connected to said first voltage comparator and said charge pump, said first enabling circuit disabling said discharge signal when said first comparison signal indicates that said control voltage is not higher than said first reference voltage; wherein said charge pump includes:

a charge current source supplied with a power source voltage, a first PMOS transistor which has a gate supplied with said charge signal, a source connected to said charge current source, and a drain connected to said filter, a discharge current source connected to ground, and a first NMOS transistor which has a gate supplied with said discharge signal, a source connected to said second current source, and a drain connected to said filter;

wherein said first voltage comparator produces said first comparison signal having a logic high level when said control voltage is not higher than said first reference voltage, and wherein said first enabling circuit comprises:

a first inverter connected to said first voltage comparator which inverts said first comparison signal to produce a first inverted signal having a logic low level, a second NMOS transistor having a gate connected to said first inverter, a drain supplied with said discharge signal, and a source connected to said gate of the first NMOS transistor, said second NMOS transistor disabling said discharge signal when said first inverted signal has said logic low level, and a third NMOS transistor having a gate connected to said first voltage comparator, a drain connected to said gate of the first NMOS transistor, and a source connected to ground, said third MOS transistor grounds said gate of the first NMOS transistor when said first comparison signal is said logic high level.

5. A phase locked loop for producing an output clock signal which is provided to an output terminal and which is synchronized with an input signal supplied to an input terminal, said phase locked loop comprising:

a phase comparator connected to said input terminal and said output terminal, said phase comparator comparing a phase of said input signal with a phase of said output clock signal and producing charge and discharge signals in response to a phase difference between said input signal and said output clock signal;

a charge pump, connected to said phase comparator, said charge pump producing one of a charge and a discharge current in response to said charge and said discharge signals;

a filter, connected to said charge pump, said filter filtering said charge and discharge currents and producing a control voltage in response thereto;

a voltage controlled oscillator circuit, connected to said filter, said voltage controlled oscillator circuit producing said output clock signal in response to said control voltage;

a first voltage comparator, connected to said filter, said first voltage comparator comparing said control voltage with a first reference voltage and producing a first comparison signal in response to a difference between said control voltage and said first reference voltage; and a first enabling circuit connected to said first voltage comparator and said charge pump, said first enabling circuit disabling said discharge signal when said first comparison signal indicates that said control voltage is not higher than said first reference voltage; wherein said charge pump includes:

a charge current source supplied with a power source voltage, a first PMOS transistor which has a gate supplied with said charge signal, a source connected to said charge current source, and a drain connected to said filter, a discharge current source connected to ground, and a first NMOS transistor which has a gate supplied with said discharge signal, a source connected to said second current source, and a drain connected to said filter;

said first voltage comparator producing a logic low level as said first comparison signal when said control voltage is higher than said first reference voltage; and wherein said first enabling circuit comprises:

a first inverter connected to said first voltage comparator, said first inverter inverts said first comparison signal to produce a first inverted signal having a logic high level, a second PMOS transistor having a gate connected to said first inverter, a source supplied with said charge signal, and a drain connected to said gate of the first PMOS transistor, said second PMOS transistor disabling said charge signal when said first inverted signal has said logic high level, and a third PMOS transistor having a gate connected to said first voltage comparator, a drain connected to said gate of the first PMOS transistor, and a source supplied with said power source voltage, said third PMOS transistor providing said power source voltage to said gate of said first PMOS transistor when said first caparison signal is said logic low level.

* * * * *